United States Patent
Syngaevskiy et al.

(10) Patent No.: US 9,620,951 B2
(45) Date of Patent: Apr. 11, 2017

(54) OVERCURRENT PROTECTION DEVICE AND METHOD OF OPERATING A POWER SWITCH

(75) Inventors: Vasily Alekseyevich Syngaevskiy, Moscow (RU); Laurent Guillot, Seysses (FR); Philippe Rosado, Fonsorbes (FR); Denis Sergeevich Shuvalov, Zelenograd (RU); Alexander Petrovich Soldatov, Zelengrad (RU)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 13/985,887

(22) PCT Filed: Feb. 18, 2011

(86) PCT No.: PCT/RU2011/000107
§ 371 (c)(1),
(2), (4) Date: Aug. 16, 2013

(87) PCT Pub. No.: WO2012/112066
PCT Pub. Date: Aug. 23, 2012

(65) Prior Publication Data
US 2013/0321966 A1     Dec. 5, 2013

(51) Int. Cl.
*H02H 3/00*     (2006.01)
*H02H 3/093*    (2006.01)
*H03K 17/082*   (2006.01)

(52) U.S. Cl.
CPC .......... *H02H 3/093* (2013.01); *H03K 17/082* (2013.01)

(58) Field of Classification Search
CPC .............................. H02H 3/093; H02J 7/0016
(Continued)

(56) References Cited

U.S. PATENT DOCUMENTS 5,898,557 A    4/1999   Baba et al.
7,468,874 B1   12/2008  Guo
(Continued)

FOREIGN PATENT DOCUMENTS

CN    1060744 A      4/1992
JP    11108969 A     4/1999
(Continued)

OTHER PUBLICATIONS

International Search Report and Written Opinion correlating to PCT/RU2011/000107 dated Oct. 17, 2011.
(Continued)

*Primary Examiner* — Thienvu Tran
*Assistant Examiner* — Lucy Thomas
(74) *Attorney, Agent, or Firm* — Charlene R. Jacobsen

(57) ABSTRACT

An overcurrent protection device comprises a maximum-allowed-current unit and a power switch. The maximum-allowed-current unit determines a maximum allowed current in real-time. The maximum allowed current is determined at least partially on an instantaneous level of a load voltage. The load voltage is a voltage across a load to be powered. The power switch is connectable with a switch input to a voltage supply and with a switch output to the load, for providing power to said load. The power switch has a conductive state and a nonconductive state, and is arranged to assume the nonconductive state in response to an indication that a current through the power switch is exceeding the maximum allowed current. A method of operating a power switch is also described.

19 Claims, 12 Drawing Sheets

(58) Field of Classification Search
USPC .................................................. 361/79, 87
See application file for complete search history.

(56) References Cited

U.S. PATENT DOCUMENTS

| | | |
|---|---|---|
| 7,468,877 B2 | 12/2008 | Oki et al. |
| 7,564,667 B2 | 7/2009 | Veroni |
| 7,619,865 B2 | 11/2009 | Thiery et al. |
| 7,639,067 B1 | 12/2009 | Perisetty |
| 7,872,842 B2 | 1/2011 | Wang et al. |
| 8,598,859 B2 | 12/2013 | Furuichi et al. |
| 8,760,832 B2 | 6/2014 | Ueta et al. |
| 2003/0072120 A1 | 4/2003 | Ishikawa et al. |
| 2005/0237688 A1 | 10/2005 | Wong et al. |
| 2008/0100978 A1 | 5/2008 | Maebara et al. |
| 2008/0203942 A1 | 8/2008 | Turpin et al. |
| 2009/0167272 A1 | 7/2009 | Furuichi et al. |
| 2010/0134939 A1* | 6/2010 | Takahashi et al. ............ 361/87 |
| 2013/0314832 A1 | 11/2013 | Guillot et al. |
| 2013/0321966 A1 | 12/2013 | Syngaevskiy et al. |

FOREIGN PATENT DOCUMENTS

| | | |
|---|---|---|
| JP | 2000305636 A | 11/2000 |
| JP | 2004140907 A | 5/2004 |
| JP | 2010113877 A | 5/2010 |
| JP | 2010218203 A | 9/2010 |
| WO | WO-2004/042793 A2 | 5/2004 |
| WO | 2006/111187 A1 | 10/2006 |
| WO | 2010/012323 A1 | 2/2010 |

OTHER PUBLICATIONS

Communication pursuant to Article 94(3) EPC for application 11 754 553.3 dated Oct. 5, 2015.
Communication pursuant to Article 94(3) EPC for application 11 754 553.3 dated Mar. 1, 2016.
Non-Final Office Action mailed Dec. 17, 2015 for U.S. Appl. No. 13/983,150, 8 pages.

* cited by examiner

OVERCURRENT PROTECTION DEVICE AND METHOD OF OPERATING A POWER SWITCH

CROSS-REFERENCE TO RELATED APPLICATION(S)

This application is related to co-pending U.S. patent application Ser. No. 13/983,150, entitled "OVERCURRENT PROTECTION DEVICE AND METHOD OF OPERATING A POWER SWITCH," filed on Aug. 1, 2013, which is a National Stage Entry under 37 C.F.R. §371 of PCT/RU2011/000108, filed Feb. 18, 2011, the disclosure of which is hereby expressly incorporated by reference in its entirety.

FIELD OF THE INVENTION

This invention relates to an overcurrent protection device and a method of operating a power switch.

BACKGROUND OF THE INVENTION

An electric device may comprise a protective mechanism for protecting the device against high electric currents. Such currents may arise, for example, in the event of a short circuit, accident or other kind of failure. The protective mechanism may be arranged to interrupt an electric circuit in which an overcurrent has been detected. An overcurrent is an electric current that is greater than a maximum allowed current. A simple example of a protective mechanism is a fuse that is blown when the electric current through the fuse exceeds a maximum allowed current. Electronic protective mechanisms also exist.

Defining the maximum allowed current for a given application can be challenging because some electric devices may draw a large current when first turned on and a considerably lower stationary current after conductors in the device have heated up. This phenomenon is usually due to the fact that the electric resistance of a conductor tends to change, e.g. increases, as the temperature of the conductor increases.

For example, the electric device to be protected may be an incandescent lamp. The incandescent lamp may, for example, be a halogen lamp. Before the lamp is turned on, the temperature and, thus, the resistance of the lamp's filament may initially be very low. At turn-on, the temperature of the filament may start to rise from the ambient temperature. As the initial resistance may initially be low, a large initial current may occur when the lamp is turned on. A large initial current into a load upon turn-on is referred to as an inrush current. An inrush current may be many times (e.g. ten times) greater than a nominal current. The nominal current may be defined as the current through the load when the load has reached a stationary temperature. The expressions nominal current, stationary current, and steady state current may be interchangeable. Both the inrush current and the steady state current may depend on the voltage applied at the lamp. The voltage applied at the lamp may, in turn, be a function of a supply voltage. The supply voltage may notably be a direct current (DC) voltage, e.g. provided by a battery. A DC voltage is a voltage which remains substantially constant over a prolonged period, e.g. over a large number of cycles during which the load may be switched on and off. A protective mechanism should allow the inrush current to flow in the load, e.g., in the wiring harness, but only for a specified time, e.g., not longer than one hundred milliseconds after switching the lamp on.

International patent application publication WO 2006/111187 A1 (Turpin) describes a current driver circuit having a current limit that is continuously or intermittently adjusted. This adjustment may be based on the change of the load impedance over time, which may be substantially equivalent to a temperature change.

SUMMARY OF THE INVENTION

The present invention provides an overcurrent protection device and a method of operating a power switch as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Figure 1:
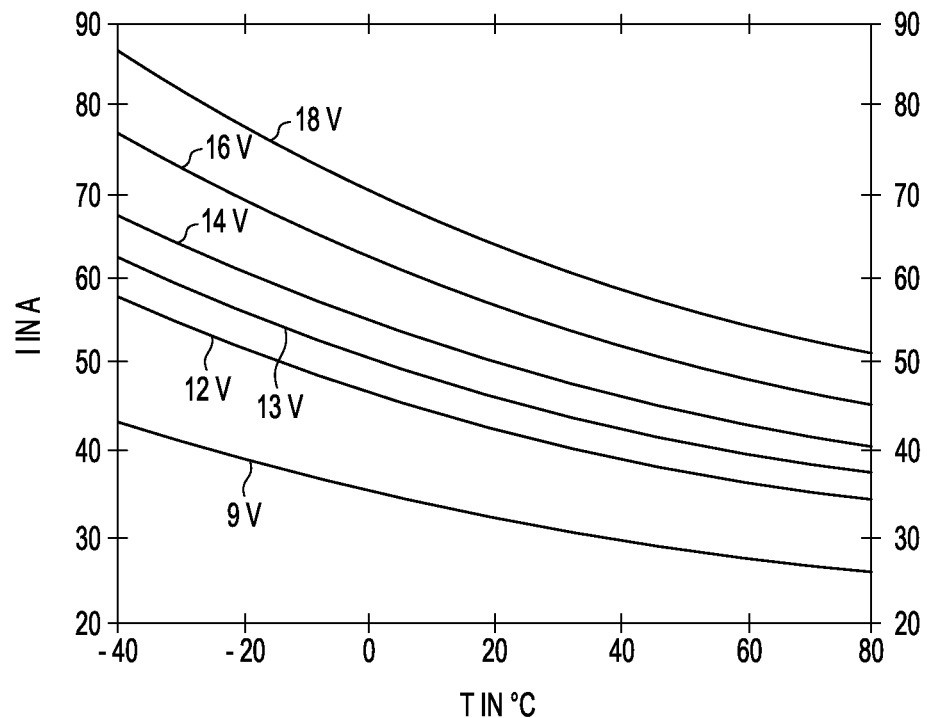
FIG. 1 shows a schematic plot of a current through an example load as a function of temperature, for different amplitudes of a voltage applied at the load.

FIG. 1 illustrates by way of example an electric current I that flows through a load when a voltage is applied at the load as a function of a temperature T of the load. At any given temperature T, the current I may be an increasing function of the applied voltage V. For example, the current I may be related to the applied voltage V according to Ohm's law as V=R*I, where R is the resistance of the load. In the figure, the current I in ampere (A) is plotted versus the temperature T in degrees Celsius (° C.), for six different stationary values of the applied voltage, namely, 9 V, 12 V, 13 V, 14 V, 16 V and 18 V. The load may, for example, be an incandescent lamp. In the plot, the resulting current I is seen to be a decreasing function of the temperature T for each of the indicated voltage values. For example, the current I observed with an applied voltage of 18 V drops from about 86 A at a temperature of minus 40° C. to about 51 A at a temperature of 80° C. Of course, these values relate to a specific example of a load and may differ for a different load.

The plot may be representative of the most common case, namely the case in which the resistance of the load increases, and hence the current I decreases, smoothly with the temperature T. It is pointed out, however, that the present disclosure is not restricted to this case but may also be applicable to loads having a resistance that depends on the temperature in a different manner.

Figure 2:
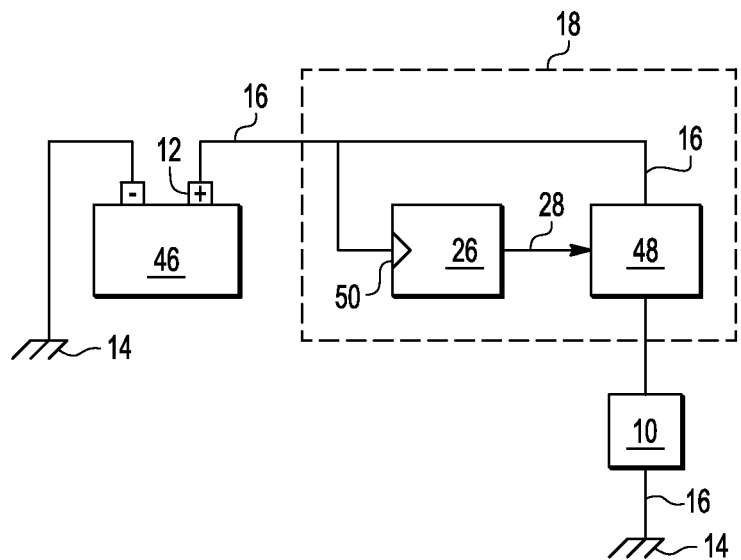
FIG. 2 schematically shows an example of an embodiment of an overcurrent protection device.

FIG. 2 illustrates in a schematic and simplified manner an example of an embodiment of an overcurrent protection device 18. In the example, a load 10 is coupled between a first voltage supply 12 and a second voltage supply 14, for example via a conductor 16. The load 10 may, for example, be an incandescent lamp, a cathode wire, a semiconductor device, or any other kind of electric load. A resistance of the load 10 may have a positive temperature coefficient. The first voltage supply and the second voltage supply may, for example, be terminals of a voltage source. The voltage source may, for example, be a battery, a fuel cell, a fuel cell stack, a solar cell or an assembly of solar cells, or any other kind of voltage provider. In the present example, the first voltage supply 12 provides a positive supply voltage and the second voltage supply 14 is a ground potential (ground). The overcurrent protection device 18 may be operable to connect and disconnect the load 10 from one or both of the first and second voltage supplies 12, 14. In the example, the overcurrent protection device 18 is coupled between the first voltage supply 12 and the load 10. In the example, the overcurrent protection device 18 is operable to disconnect the load 10 from the first voltage supply 12. For example, the overcurrent protection device 18 may complete and, alternatively, interrupt the conductor 16 so as to couple/decouple the load 10 to/from the power supply.

As shown, the overcurrent protection device 18, according to the present example embodiment, may comprise a switch unit 48 and a pulse width modulation (PWM) unit 26. The switch unit 48 may for example be a smart switch, e.g. as sold by the applicant under the name "eXtreme switch". The PWM unit 26 may be operable to generate a pulse width modulated signal (PWM) control signal 28. The switch unit 48 may be operable to be controlled via the PWM control signal 28. For example, the switch unit 48 may connect the load 10 to the supply voltage (in the present example, to the first voltage supply 12) in response to the PWM control signal 28 indicating a first state and disconnect the load 10 from the supply voltage in response to the PWM control signal indicating a second state. The first state and the second state may, for example, be indicated respectively by a high voltage level and a low voltage level or, vice versa, output by the PWM unit 26. The PWM control signal 28 may have a duty cycle in the range of zero to one. The duty cycle may be the duration of a first interval divided by the combined duration of a first and second interval, wherein the first interval may be the interval during which the PWM control signal 28 indicates the first state, and the second interval may be a subsequent interval during which the PWM control signal 28 indicates the second state. The duty cycle of the PWM control signal 28 may thus be proportional to an average voltage applied at the load 10.

In the present example, the PWM unit 26 may be operable to set the duty cycle of the PWM control signal 28 in dependence on the supply voltage, i.e., depending on the voltage between the first voltage supply 12 and the second voltage supply 14. The PWM unit 26 may thus be operable to compensate for variations in the supply voltage by varying the duty cycle of the PWM control signal 28. It may thus be ensured that the power consumed by the load 10 is constant when averaged over one cycle of the PWM control signal 28. More specifically, the PWM unit 26 may set the duty cycle □ such that the product □*V remains constant, where V is the supply voltage. Thus, the PWM unit 26 may be operable to sense the supply voltage and control the load 10 accordingly.

The PWM unit 26 may, for example, be a microcontroller unit (MCU). In the shown example, the PWM unit 26 may comprise an analog-to-digital converter (ADC) 50 for generating a digital value indicative of the supply voltage. The PWM unit 26 may thus be operable to set the duty cycle of the PWM control signal 28 according to said digital value. For instance, the ADC may receive an analog value, e.g. the supply voltage directly, and output a digital value to a control input of the PWM unit 26.

The switch unit 48 may be operable to disconnect the load 10 from the supply voltage in response to an indication that a current through the load 10 is exceeding a maximum allowed current. The maximum allowed current may be defined as a function of time, illustrated further by way of example only in reference to FIG. 3. For example, the switch unit 48 may sense a current through the load 10 and check whether the sensed current does not exceed the maximum allowed current.

Figure 3:
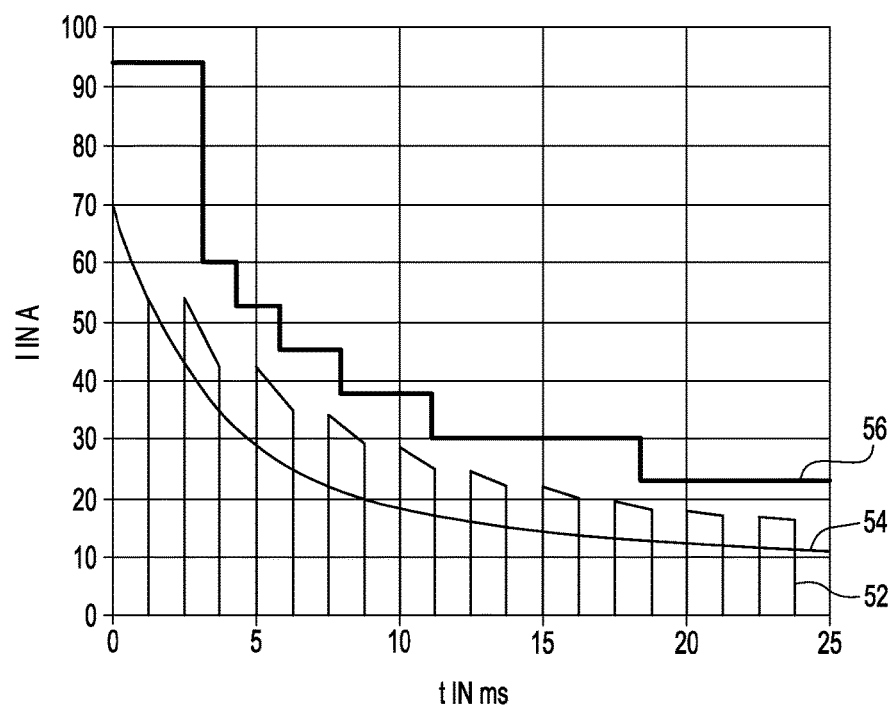
FIG. 3 shows a schematic plot of a first current, a second current and a maximum allowed current as functions of time, according to an example of an embodiment.

A first current 52, a second current 54, and a maximum allowed current 56 are schematically plotted in FIG. 3 as functions of a time t. The first current 52 may be a current through, e.g., the load 10 (see FIG. 2) when the PWM control signal 28 has a duty cycle of, e.g., 50%. The second current 54 may be observed, e.g., in the load 10 (see FIG. 2) when the PWM control signal 28 has a duty cycle of 1, i.e.

when the PWM control signal is continuous. The first current 52 is, therefore, discontinuous, whereas the second current 54 is continuous with respect to time t. The maximum allowed current may, for example, be defined according to an expected inrush current. More specifically, the maximum allowed current 56 may be defined so as to permit an expected inrush current to flow through the load 10. The maximum allowed current 56 may thus be greater than the expected inrush current for any point in time t. In the example, the maximum allowed current 56 is a decreasing function of time. A function F(X) is called decreasing if X2 being greater than X1 implies that F(X2) is less than or equal to F(X1). A function F(X) is called increasing if X2 being greater than X1 implies that F(X2) is greater than or equal to F(X1).

In the example shown, the maximum allowed current 56 may be a step function. The switch unit 48 may be operable to check at any time t whether the current through the load 10 does not exceed the maximum allowed current 56. More specifically, the switch unit 48 may be operable to check continuously, quasi-continuously or intermittently whether the current through the load 10 is below the maximum allowed current 56. Intermittently may mean, e.g., at least twice after first switching on the load 10. Quasi-continuously may mean at least once per period of the PWM control signal. Continuously may mean at every instant. The maximum allowed current 56, considered a function of time, may be predefined. The predefined maximum allowed current may, for example, be adjustable via a serial peripheral interface (SPI). The maximum allowed current 56 may need to be adjusted, for example, when the load 10 is replaced by another load (not shown) having different characteristics.

Figure 4:
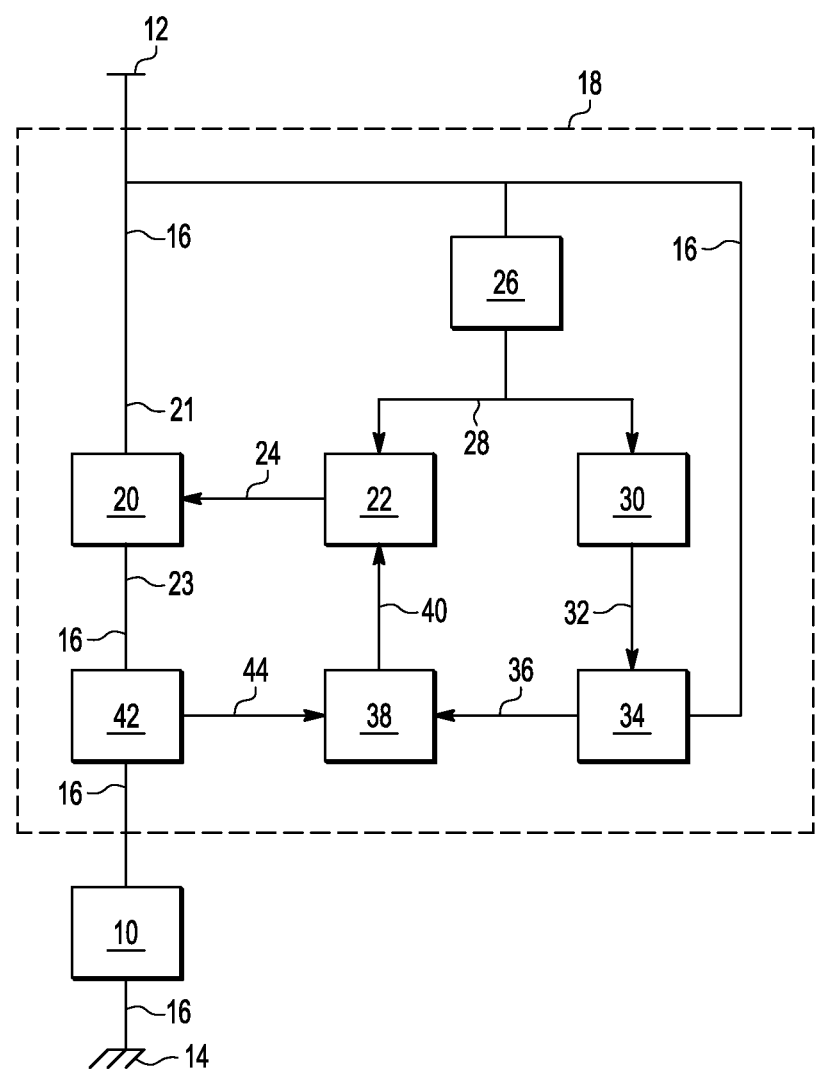
FIG. 4 schematically shows an example of an embodiment of an overcurrent protection device.

Referring now to FIG. 4, an example of an embodiment of an overcurrent protection device 18 is shown. The overcurrent protection device 18 may include the features of the overcurrent protection device 18 described above in reference to FIG. 2. The overcurrent protection device 18 may, for example, be an eXtreme switch, or comprise an eXtreme switch. The overcurrent protection device 18 may comprise a maximum-allowed-current unit 34 for determining a time-dependent maximum allowed current, the maximum allowed current being determined at least partially on a level of a supply voltage provided by a voltage supply 12. The overcurrent protection device 18 may further comprise a power switch 20 connectable with a switch input 21 to said voltage supply and with a switch output 23 to a load 10, for providing power to said load 10. The power switch 20 may have a conductive state and a nonconductive state, and be arranged to assume the nonconductive state in response to an indication that a current through the power switch 20 is exceeding the maximum allowed current.

In the present example, overcurrent protection device 18 comprises a maximum-allowed-current unit 34 for determining a time-dependent maximum allowed current which is at least partially based on the level of the supply voltage, and a power switch 20 having a conductive state and a nonconductive state. The maximum-allowed-current unit may thus adapt the maximum allowed current to variations of the supply voltage. This may render the overcurrent protection device 18 more reliable. For example, the maximum allowed current may be an increasing function of the supply voltage. The maximum allowed current may notably be proportional to the supply voltage. An embodiment of a maximum-allowed-current unit may comprise an ADC for generating a digital value indicative of the supply voltage.

The overcurrent protection device 18 may further comprise a load 10, e.g. an incandescent lamp, coupled in series with the power switch 20. The power switch 20 may be arranged to assume the nonconductive state in response to an indication that a current through the power switch 20 is exceeding the maximum allowed current (e.g. one of the maximum allowed currents I1, I2 plotted in FIG. 8). To this end, the overcurrent protection device 18 may comprise a current sensor 42 for determining a value of a current that is flowing through the power switch 20.

The overcurrent protection device may comprise a switch controller 22 for setting the power switch 20 alternatively into the conductive state and the nonconductive state in accordance with a pulse width modulated control signal 28. The overcurrent protection device 18 may further comprise a turn-on detector 30 for detecting a turn-on event. A turn-on event may comprise, for example: the pulse width modulated control signal 28 indicating during an interval having a length of at least a minimum off-time that the power switch 20 is to assume the nonconductive state, followed by the pulse width modulated control signal 28 indicating that the power switch 20 is to assume the conductive state. The maximum-allowed-current unit may be operable to determine the supply voltage in response to the turn-on detector 30 detecting a turn-on event. Alternatively or additionally, the maximum-allowed-current unit 34 may be operable to determine the maximum allowed current according to a real-time value of the supply voltage. Alternatively or additionally, the maximum-allowed-current unit 34 may be operable to determine the maximum allowed current as a function of an accumulated time during which the power switch 20 was in the conductive state. The maximum allowed current may, for example, be greater than an expected inrush current. For example, the maximum allowed current may be a decreasing function of time.

The overcurrent protection device 18 may comprise a timer for indicating a current reference time. The reference time may, for instance, be the usual physical time relative to a suitable initial moment, e.g. relative to a turn-on event. The physical time is the usual, uninterrupted time, as may be measured by a timer that is continuously running. Alternatively, the reference time may, for example, be an accumulated time during which the power switch was in the conductive state, e.g. since a turn-on event. The timer may notably be the timer 60 described in reference to FIG. 6. The timer may be associated with a predefined reset value.

The reset value may for example be zero. The timer may, for example, be reset to the reset value in response to the turn-on detector 30 detecting a turn-on event. The maximum-current unit may thus be arranged to determine the maximum allowed current according to the current reference time.

The overcurrent protection device 18 may further comprise a pulse-width modulation unit 26 for defining a duty cycle at least partially based on the supply voltage, and for generating the pulse width modulated control signal 28 such that the pulse width modulated control signal 28 has the defined duty cycle. The duty cycle may, for example, be inversely proportional to the supply voltage.

In the shown example, the overcurrent protection device 18 is coupled in series with a load 10 between a first voltage supply 12 and a second voltage supply 14. The voltage supplies 12, 14 may be arranged to provide a supply voltage. The overcurrent protection device 18 may comprise, e.g., a conductor 16, a power switch 20, a switch controller 22, a PWM unit 26, a turn-on detector 30, a maximum-allowed-current unit 34, an comparator 38, and a current sensor 42. The conductor 16 may, for example, be of the kind described above in reference to FIG. 2. Furthermore, the PWM unit 26 may, for example, also be of the kind described above in reference to FIG. 2. The same applies analogously to the voltage supplies 12, 14 and the load 10.

The overcurrent protection device 18 may operate, for example, as follows. The PWM unit 26 may, for example, be responsive to an external signal (not shown) such as an user input signal for powering on/powering off the load 10. The PWM unit 26 may generate a PWM control signal 28. The PWM module 26 may adjust a duty cycle of the PWM control signal 28 according to a supply voltage. The supply voltage may, for example, be the voltage between the first voltage supply 12 and the second voltage supply 14. In the example, PWM unit 26 may sense the supply voltage via the conductor 16. The person skilled in the art will understand that the representation of conductors in the figure may be schematic and that each of the components of the overcurrent protection device 18 discussed herein may in fact be coupled to the first voltage supply 12 and/or the second voltage supply 14. The PWM control signal 28 may be fed to both the switch controller 22 and the turn-on detector 30.

In the present example, the turn-on detector 30 may evaluate the PWM control signal 28 to detect, e.g., turn-on events and/or turn-off events. For example, the turn-on detector 30 may generate a turn-on detection signal 32 for indicating that a turn-on event has been detected. A turn-on event may, for example, be defined as the PWM control signal 28 indicating during an interval having a length of at least a minimum off time that the power switch 20 is to assume a nonconductive state, followed by the PWM control signal 28 indicating that the power switch 20 is to assume a conductive state. A turn-on event may correspond to time t=0 in FIG. 3.

The maximum-allowed-current unit 34 may, for example, determine a maximum allowed current as function of time t, wherein the time t is measured from the turn-on event. Furthermore, the maximum-allowed-current unit 34 may determine the maximum allowed current (e.g. current 56 in FIG. 3) not only according to a time but also according to the supply voltage. The supply voltage may, for example, be the voltage provided by the conductor 16. The supply voltage may be defined, for example, relative to the second voltage supply 14, e.g., relative to ground. For example, the maximum-allowed-current unit may determine the maximum allowed current for a given time t as a function of the supply voltage at time t=0, that is as a function of the supply voltage at the time of, e.g., the turn-on event. For example, the maximum-allowed-current unit 34 may sense the supply voltage in response to the turn-on detector 30 detecting a turn-on event. Alternatively, the maximum-allowed-current unit 34 may, for example, determine a maximum allowed current according to a real-time value of the supply voltage. In other words, the maximum-allowed-current unit 34 may, according to the latter example, determine the maximum allowed current as a function of both a time t and the supply voltage at the very same time t. The maximum-allowed-current unit 34 may generate a signal 36 that is indicative of the maximum allowed current. The maximum allowed sensor signal 36 may notably be a real-time signal. For example, the maximum allowed sensor signal 36 may be indicative of the maximum allowed current at the time of generating the maximum allowed sensor signal. This may ensure that the maximum allowed sensor signal 36 may correlate with an actual current through the load 10.

The maximum allowed sensor signal 36 may be fed to the comparator 38. At the same time, the current sensor 42 may generate a sensor signal 44. The sensor signal 44 may be indicative of a current through the load 10, or, equivalently, through the power switch 20. For example, sensor signal 44 may be indicative of a current through the load 10. The comparator 38 may determine whether the sensed current as indicated by the sensor signal 44 exceeds the maximum allowed current as indicated, e.g., by the maximum allowed sensor signal 36. The comparator 38 may generate a comparison signal 40. Comparison signal 40 may indicate, for example, whether or not the sensed current is less than the maximum allowed current. For example, the comparator 38 may output TRUE (e.g. represented by a high voltage level) when the sensed current is less than the maximum allowed current and output FALSE (e.g. represented by a low voltage level) when the sensed current is greater than the maximum allowed current.

The PWM control signal 28 and the comparison signal 40 may, for example, be fed to the switch controller 22. The switch controller 22 may, for example, determine whether the power switch 20 is to be set into a conductive state or into a nonconductive state based on the PWM control signal 28 and the comparison signal 40. The switch controller 22 may generate a switch control signal 24. The switch controller 22 may, for example, be an AND gate. In this case, the AND gate 22 may receive the PWM control signal 28 and the comparison signal 40 as input signals and output the switch control signal 24 as an output signal. The power switch 20 may assume, alternatively, its conductive and its nonconductive state as indicated by the switch control signal 24. For example, when the PWM control signal 28 and the comparison signal 40 both indicate TRUE, the switch controller 22 may output TRUE for setting the power switch 20 into the conductive state. In contrast, when one or both of the PWM control signal 28 and the comparison signal 40 indicates FALSE, the switch controller 22 may output FALSE for setting the power switch 20 into its nonconductive (isolating) state. In the conductive state, an electric current may flow between the switch input 21 and the switch output 23 when a voltage is applied therebetween. In the nonconductive state, an electric current between the switch input 21 and the switch output 23 may be considerably lower than in the conductive state, given the same voltage. The power switch 20 may, for example, be a transistor. Switch input 21 and switch output 23 may, for example, be a source and a drain, respectively, or vice versa.

Figure 5:
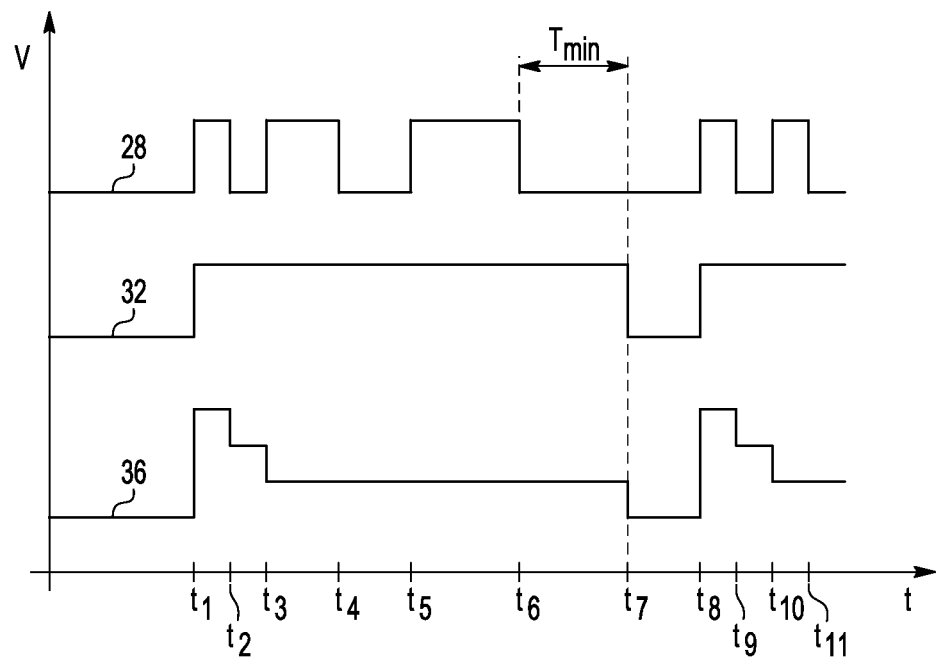
FIG. 5 shows a schematic plot of a pulse width modulated (PWM) signal, a turn-on detection signal, and a maximum allowed sensor signal according to an example of an embodiment.

Referring now to FIG. 5, examples of a PWM control signal 28, a turn-on detection signal 32, and a maximum allowed current signal 36 are plotted in a schematic and simplified manner. In the plot, the three signals 28, 32 and 36 are offset relative to each other along the vertical axis (the V axis) for the sake of clearness. The maximum allowed current signal 36 may depend on the turn-on detection signal 32. The turn-on detection signal 32 may depend on the PWM control signal 28. Each of these signals may be represented, e.g., by a voltage V. For example, PWM control signal 28 may be represented by a voltage output by the PWM unit 26.

The turn-on detection signal 32 may be represented by, e.g., a voltage output by the turn-on detector 30. The maximum allowed current signal 36 may be represented by, e.g., a voltage output by the maximum-allowed-current unit 34. In the example, any low-to-high transition (rising edge) in the PWM control signal 28 may trigger a corresponding rising edge in the turn-on detection signal 32. Rising edges in the PWM control signal 28 that occur while the turn-on detection signal 32 is high may have no effect on the turn-on detection signal 32. Any high-to-low transition (falling edge) in the PWM control signal 28 may trigger a falling edge in the turn-on detection signal 32 with a delay T_min, unless the falling edge in the PWM control signal 28 is followed by a rising edge within the defined delay T_min. The delay T_min may, for example, be 1.4 seconds. Thus, a falling edge in the PWM control signal 28 may have no effect on the turn-on detection signal 32 if the falling edge is followed by a rising edge within the defined delay.

In the example, the PWM control signal 28 exhibits rising edges at times t1, t3, t5, t8, and t10 and falling edges at times t2, t4, t6, t9, and t11. In the example, the falling edges at t2, t4, and t9 have no effect on the turn-on detection signal 32 as they are respectively succeeded by rising edges at times t3, t5, and t10 within the defined delay. In the example, only the falling edge in the PWM control signal 28 at time t6 is not succeeded by a rising edge within the defined delay T_min. Accordingly, the falling edge in PWM control signal 28 at time t6 triggers a falling edge in the turn-on detection signal 32, namely, the falling edge at time t7. Time t7 is time t6 plus the delay, i.e. t7=t6+T_min. The rising edge in the PWM control signal 28 at time t8 then triggers the rising edge in the turn-on detection signal 32 at time t8. Rising edges and falling edges in the turn-on detection signal 32 may indicate turn-on and turn-off events, respectively. In the example, turn-on events are detected e.g. at times t1 and t8. A turn-off event is detected e.g. at t7.

Each detected turn-on event may trigger the maximum-allowed-current unit 34 to control a signal amplitude or a digital signal value (in the present example, a voltage) according to a predefined maximum allowed current profile. In this application, a current profile is a current considered as a function of time in an interval of interest. The maximum allowed current unit 34 may thus generate the maximum allowed current signal 36. The instant at which a turn-on event is detected may thus serve as the initial instant of the maximum allowed current profile (time t=0 in the example shown in FIG. 3).

Figure 6:
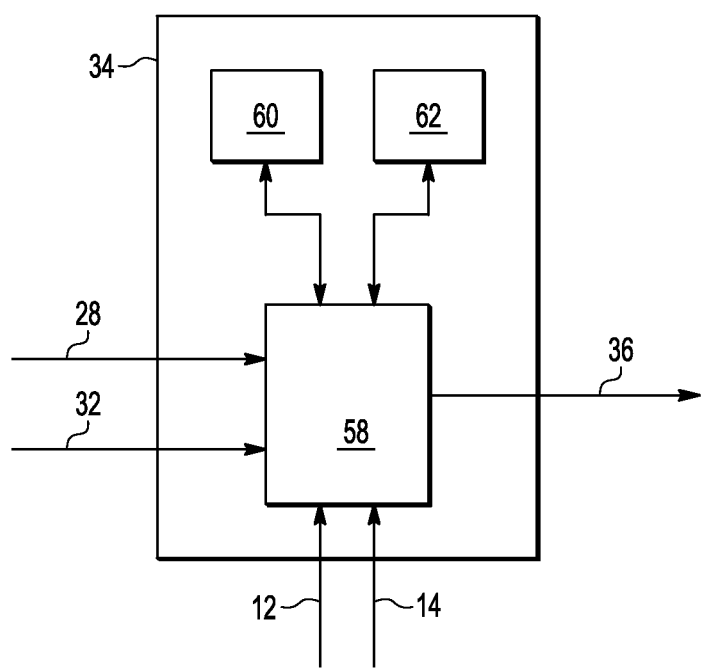
FIG. 6 schematically shows an example of an embodiment of a maximum-allowed-current unit.

FIG. 6 illustrates an example embodiment of the maximum-allowed-current unit 34 in a schematic and simplified manner. The maximum-allowed-current unit 34 may, for example, be provided by a microcontroller or by dedicated circuitry. The maximum-allowed-current unit 34 may comprise a processor 58, a timer 60, and/or a memory 62. The memory 62 may, for example, contain data for enabling the processor 58 to determine the maximum allowed current as a function of time and supply voltage. In one embodiment, the data may comprise a maximum allowed current profile and instructions for enabling the processor 58 to scale the maximum allowed current profile as a function of a supply voltage value. For example, the data may include time scaling factors and/or amplitude scaling factors. In the same or in another embodiment, the data may comprise a look-up table for defining at least two different maximum allowed current profiles. The processor 58 may, e.g., be arranged to select one of these profiles as a function of a supply voltage.

Determining a maximum allowed current may further involve an accumulated time. The accumulated time may be defined, for example, as a total time after a turn-on event during which the power switch 20 was in the conductive state. The accumulated time may thus be thought of as a time integral over the PWM control signal 28 starting at the most recent turn-on event. The idea behind this is that any period during which the power switch is in the nonconductive state may not contribute to a rise in temperature of the load 10. Any maximum allowed current profile may, therefore, be defined with respect to said accumulated time rather than in respect to the physical time t as shown in FIG. 3. The processor 58 may, therefore, determine at any time t a corresponding accumulated time. From the accumulated time, the processor 58 may determine a maximum allowed current. The timer 60 may be reset in response to a detected turn-on event. For example, the timer 60 may further be set into a stop mode in response to a falling edge in the PWM control signal 28 and into a run mode in response to a rising edge in the PWM control signal 28. A stop mode is a mode in which the timer 60 is inactive. A run mode is a mode in which the timer 60 counts the physical time. The timer 60 may thus count the accumulated time.

Thus, the maximum-allowed-current unit 34 may comprise a memory 62 containing data for defining the maximum allowed current as a function of at least a time variable and a supply voltage variable. For example, the maximum-allowed-current unit 34 may be operable to scale a maximum allowed current profile as a function of the supply voltage. The maximum-allowed-current unit 34 may, notably, be operable to scale the maximum allowed current profile in amplitude and/or in time.

Figure 7:
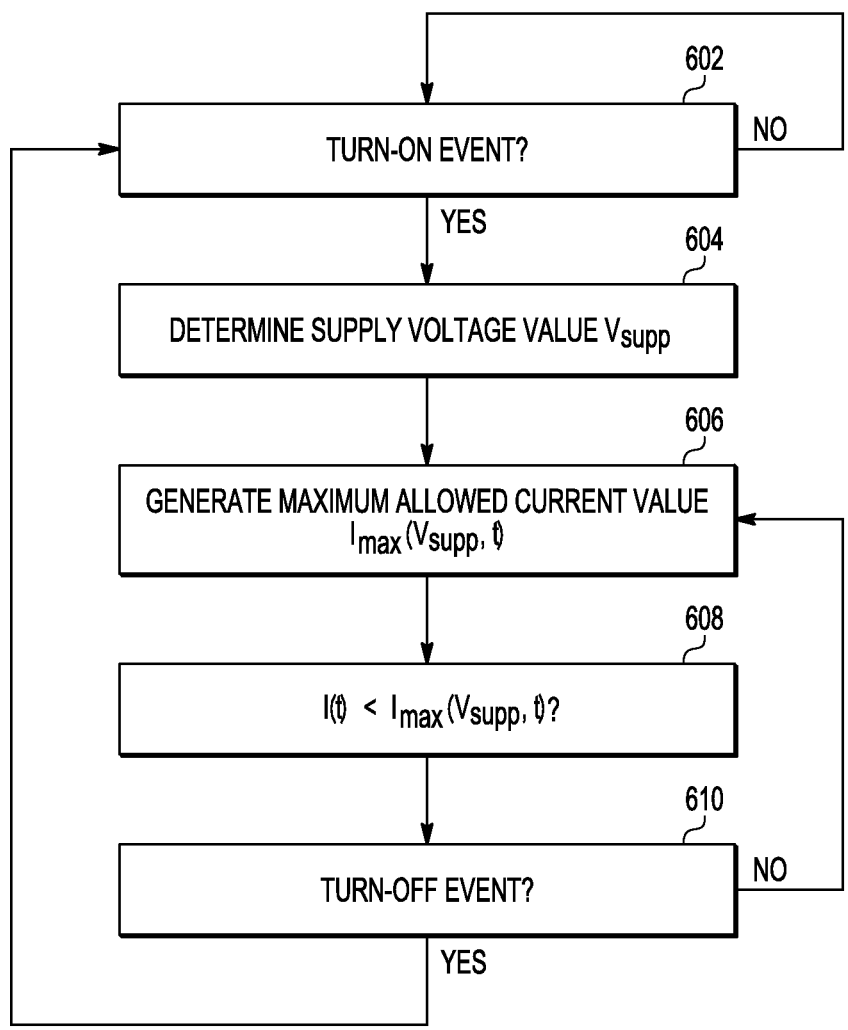
FIG. 7 shows a schematic flow chart of an example of a method of operating a power switch.

Referring now to FIG. 7, a flow chart of an example of a method of operating a power switch is shown. The method according to the example comprises determining a maximum allowed current according to an applied supply voltage and setting the power switch into the nonconductive state in response to an indication that a current through the power switch is exceeding the maximum allowed current. Determining the maximum allowed current may comprise detecting a turn-on event and, in response thereto, determining the supply voltage.

As shown with block 602, it may be determined whether a turn-on event has been detected. In this event, the process may continue; otherwise, the process may return to block 602.

In block 604, a value or amplitude of a supply voltage may be determined. This may involve measuring the supply voltage, e.g., using a voltage sensor.

In subsequent block 606, a maximum allowed current value may be generated on the basis of both the instantaneous time t and the supply voltage determined in the preceding block 604. Generating the maximum allowed current value may involve, e.g., consulting a look-up table and/or determining an accumulated time, e.g. as described above in reference to FIG. 6.

In subsequent block 608, it may be determined whether a current through the power switch is less than the maximum allowed current determined in previous block 606. If it is determined that the current through the power switch is greater than the maximum allowed current, the power switch may be set into a nonconductive state; otherwise, no action may be taken.

In subsequent block 610, it may be determined whether a turn-off event has been detected. If a turn-off event has been detected, the process may return to block 602; otherwise, the process may return to block 606. In another embodiment (not shown), the process may return to block 604 instead of block 606. In other words, the supply voltage may be determined in response to the turn-on event (as illustrated in FIG. 7) or immediately before each instance (block 606) of generating the maximum allowed current value. In practice, the supply voltage may be fairly constant over many turn-on/turn-off cycles. In this situation, it may be completely sufficient to determine the supply voltage only once after each turn-on event, as illustrated in the figure.

Figure 8:
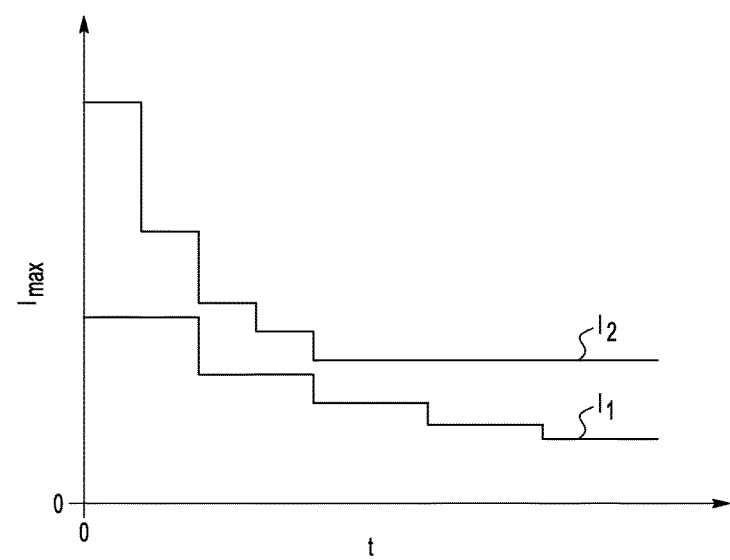
FIG. 8 shows a schematic plot of a first maximum allowed current profile and a second maximum allowed current profile, according to an example of an embodiment.

Referring now to FIG. 8, a first maximum allowed current I1 and a second maximum allowed current I2 are plotted as functions of a time t in a schematic and simplified manner. The time t may be the usual physical time or an accumulated time as described above with reference to FIG. 6. For example, the maximum-allowed-current unit 34 may generate either the first or the second maximum allowed current profile, i.e., either I1 or I2 depending on the supply voltage applied at the overcurrent protection device 18. The maximum allowed current protection unit 36 may, of course, be arranged to generate or select among more than two different maximum allowed current profiles. For example, maximum-allowed-current unit 34 may be arranged to generate or select among a continuous set of maximum allowed current profiles, e.g., using scaling factors. In the present example, I1 and I2 are related as follows:

$$I2(t)=A*I1(B*t)$$

where A is an amplitude scaling factor and B is a time scaling factor; in the example, A=2 and B=2. The maximum-allowed-current unit 34 may be arranged to determine the scaling factors according to the supply voltage. Thus, the scaling factors A and/or B may be functions of the supply voltage V. As mentioned above, the supply voltage V may, for example, be the supply voltage measured at a defined instant, e.g., after detecting a turn-on event or the supply voltage measured in real-time.

The maximum allowed currents I1 and I2 may correspond to expected inrush currents. I1 and/or I2 may be offset relative to the respective inrush current by some fixed offset. Thus, it may be ensured that the actual current flowing through the power switch may always be less than the maximum allowed current during normal operation, i.e., if no failure or accident occurs. In the example, I2 corresponds to a greater supply voltage than I1. I2 may tend to its stationary value more rapidly because a higher supply voltage may imply that the temperature of the load rises more rapidly, assuming the same duty cycle.

More generally, the maximum-allowed-current unit 34 may be arranged to determine a maximum allowed current I_max(V,t) as a function of the supply voltage V and of a time t. Such determination may involve scaling factors, e.g. as described above with reference to FIG. 8. However, the determination does not necessarily involve scaling factors. In particular, the maximum allowed current I_max(V,t) for a first voltage value V=V1 does not necessarily have to be related to the maximum allowed current I_max(V,t) for a different second voltage value V=V2. For example, the maximum-allowed-current unit 34 may be arranged to assign a maximum-allowed-current profile to each voltage value among a set of voltage values, e.g., using a look-up table.

Figure 9:
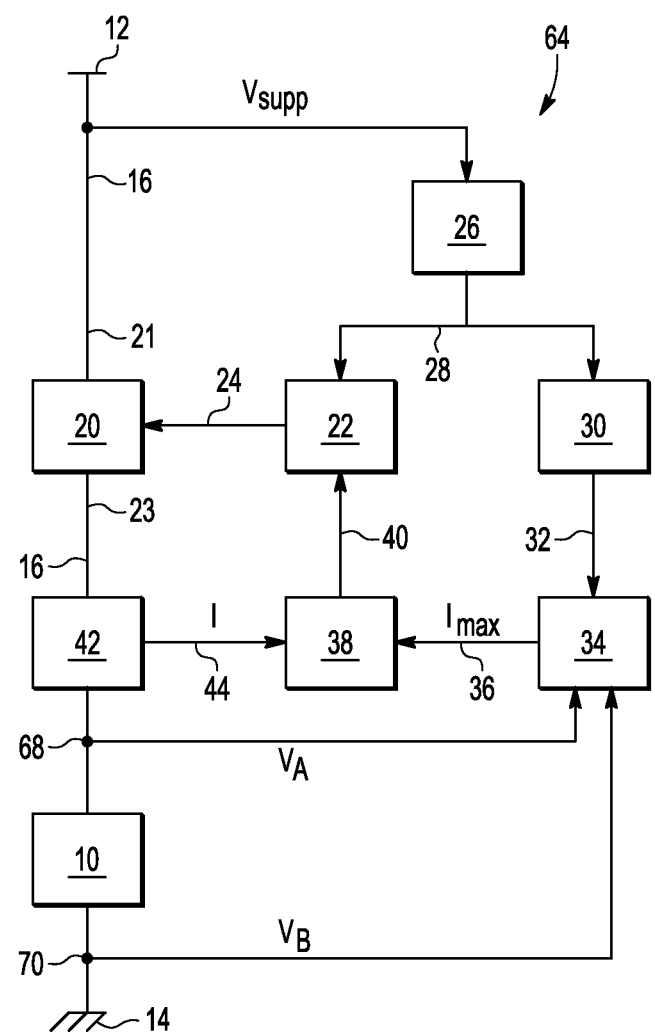
FIG. 9 schematically shows a further example of an embodiment of an overcurrent protection device.

FIG. 9 illustrates a further example of an embodiment of an overcurrent protection device 64. The overcurrent protection device 64 may, notably, comprise a load 10 coupled in series with a power switch 20, e.g. via a conductor 16. The load 10 may be, e.g., a lamp, for example, an incandescent lamp, or any other current-drawing device. A supply voltage V_supp may be applied across the load 10 by means of a first voltage supply 12 and a second voltage supply 14. The supply voltage may be defined as the voltage between the first voltage supply 12 and the second voltage supply 14. The supply voltage may notably be a DC voltage, supplied, for instance, by a battery, fuel cell or AC-to-DC voltage converter.

The supply voltage is to be distinguished from the voltage across the load 10 (load voltage). In the example, the load voltage may be the instantaneous voltage between a first node 68 and a second node 70. Nodes 68 and 70 may, for example, be contacts for contacting the load 10 to enable powering the load 10. While the supply voltage may be considered constant or slowly varying, the load voltage may notably depend on the instantaneous state of the power switch 20. For example, when the switch 20 is in a conductive state, the load voltage may be substantially equal to the supply voltage. On the other hand, when the switch 20 is in its nonconductive state, the load voltage may be considerably lower, e.g. fall to zero. Furthermore, any state change of the power switch 20 may affect the load voltage with a certain delay.

The power switch 20 may be arranged to pass from the nonconductive state into the nonconductive state via at least one intermediate state. For example, power switch 20 may be capable of assuming a discrete or continuous number of intermediate states between the nonconductive state and the conductive state. In other words, the conductivity of the power switch 20 may assume one or more intermediate values between a minimum conductivity value and a maximum conductivity value. The minimum conductivity value and the maximum conductivity value may, for example, be assumed in the two states referred to throughout this application as the "nonconductive" state and the "conductive" state, respectively. The power switch 20 may thus be capable of passing from the conductive state to the nonconductive state, and vice versa, via one or more intermediate states. A continuous or stepwise transition between the nonconductive state and the conductive state may be an inherent characteristic of the power switch 20, or the power switch 20 may be controlled, e.g. by a switch controller 22, to transition between two principle states (i.e., the nonconductive state and the conductive state) in a smooth manner rather than instantly. Thus, the slew rate of the load voltage may be limited. This may allow, for instance, the reduction of electromagnetic noise which the device 64 may produce, in particular if the power switch 20 is to be operated in accordance with a pulse width modulation (PWM) signal. Controlling the state transition of the switch 20 may thus allow that electromagnetic compatibility (EMC) requirements are met.

In the present example, the overcurrent protection device 64 may further comprise a switch controller 22 for setting the power switch 20 alternatively into the conductive state and into the nonconductive state in accordance with a pulse width modulated control signal 28. Switch controller 22 may, for example, be arranged to generate a switch control signal 24 for setting the power switch 20 alternatively into the conductive state and the nonconductive state. Switch controller 22 may, for example, be responsive to a user input (not shown) which may enable a user to switch on and off the load 10 via switch controller 22 and switch 20. In the present example, switch controller 22 may be responsive to a pulse width modulated signal 28 generated by e.g. a pulse width modulation unit 26 as described, for example, above with reference to FIG. 4.

The overcurrent protection device 64 may further comprise a maximum-allowed-current unit 34, a current sensor 42, and a comparator 38. The current sensor 42 may, for example, be coupled between the switch 20 and the load 10. The current sensor 42 may be arranged to generate a sensor signal 42 which may be indicative of the instantaneous current through the power switch 20. The power switch 20 and the load 10 being in series, the sensor signal 44 may be equally indicative of the instantaneous current through the load 10. The maximum-allowed-current unit 34 may be arranged to generate a maximum allowed current signal 36 indicative of a maximum allowed current. Comparator 38 may be arranged to compare sensor signal 44 and the maximum allowed current signal 36. More specifically, the comparator 38 may be arranged to check whether the instantaneous current indicated by the sensor signal 44 does not exceed the maximum allowed current I_max indicated by the maximum allowed current signal 36. Comparator 38 may be arranged to generate a comparison signal 40 indicative of whether or not the current through the switch exceeds the maximum allowed current I_max. Switch controller 22 may be arranged to generate the switch control signal 24 on the basis of comparison signal 40. The switch control signal 22 may thus set the power switch 20 into the nonconductive state in response to comparison signal 40 indicating that the current through the switch 20 is exceeding the maximum allowed current I_max. The current sensor 42, the maximum allowed current unit 34 and the comparator 38 thus provide an overcurrent protection mechanism.

The overcurrent protection device 64 may further comprise a turn-on detector 30 for detecting a turn-on event, for example by analysing the PWM signal 28. The turn-on event may comprise, for example, a pulse width modulated control signal 28 indicating, during an interval having a length of at least a minimum off-time, that the power switch 20 is to assume the nonconductive state, followed by the pulse width modulated control signal 28 indicating that the power switch 20 is to assume the conductive state.

The maximum-allowed-current unit 34 may be arranged to generate the maximum allowed current signal 36 in real-time. The maximum-allowed-current unit 34 may, for example, be arranged to generate the maximum allowed signal 36 according to a reference time. The reference time may, for instance, be the physical time or an accumulated time during which the load was energized. The maximum-allowed-current unit 34 may, for example, measure the reference time relative to the turn-on event.

The overcurrent protection device 64 may differ from the overcurrent protection device 18 described above in reference to FIG. 4 in that it may be operable to determine a maximum allowed current on the basis of the load voltage, rather than on the basis of the supply voltage. However, the features of overcurrent protection device 18 and of overcurrent protection device 64 are by no means exclusive and may be united in a single device. For example, it may be beneficial to determine the maximum allowed current on the basis of both the supply voltage and the load voltage.

The overcurrent protection device 64, according to the shown example, may comprise a maximum-allowed-current unit 34 for determining in real-time a maximum allowed current, said maximum allowed current being determined at least partially on an instantaneous level of a load voltage, the load voltage being a voltage across a load 10 to be powered. The overload protection device 64 may further comprise a power switch 20 connectable with a switch input 21 to a voltage supply and with a switch output 23 to the load 10, for providing power to the load 10. The voltage supply may, for example, be the first voltage supply 12 or the second voltage supply 14. The power switch 20 may have a conductive state and a nonconductive state, and be arranged to assume the nonconductive state in response to an indication that a current through the power switch 20 is exceeding the maximum allowed current.

More specifically, the maximum-allowed-current unit 34 may be arranged to determine a maximum allowed current in dependence on the instantaneous voltage across the load 10 (load voltage). As pointed out above, the load voltage differs by definition from the supply voltage. In the present example, the supply voltage may for example be the voltage across the series of components consisting of switch 20, current sensor 42 and load 10, whereas the load voltage may be the voltage experienced by the load 10. In the present example, the load voltage may thus be, e.g., the instantaneous voltage between the nodes 68 and 70. The maximum-allowed-current unit 34 may be arranged to determine the maximum allowed current only according the load voltage or, alternatively, (as in the present example) according to both the load voltage and another variable, such as the physical time or an accumulated time, or a temperature, e.g. a temperature of the load. For example, the maximum-allowed-current unit 34 may be arranged to determine the maximum allowed current so as to allow an inrush current to flow through the switch, wherein the maximum allowed inrush current may be higher than a maximum allowed current for later times, for example, as illustrated in reference to FIGS. 1 to 3.

In any case, i.e., irrespective of whether the maximum allowed current is defined as a function of further variables or not, determining the maximum allowed current on the basis of the load voltage may be beneficial, as it may allow the detecting of an overcurrent while the load voltage, i.e. the instantaneous voltage across the load 10, is lower than the nominal voltage to be applied across the load 10. For instance, the maximum-allowed-current unit may be operable to determine the maximum allowed current on the instantaneous level of the load voltage during a transition of the power switch 20 from the nonconductive state to the conductive state. Thus, the maximum allowed current may be adapted to the variation of the load voltage during a transition of the switch 20 from its nonconductive state to its conductive state or vice versa. The maximum allowed current may, for instance, be defined lower for lower load voltages. Thus, the sensitivity of the overcurrent protection mechanism may be increased for lower values of the load voltage.

It is noted that a load, such as load 10, generally has a certain resistance or impedance. When the switch 20 passes from its nonconductive state to its conductive state, the current through the load 10 and the switch 20 may, therefore, increase at a rate that may correspond to the resistance or impedance of the load 10. Should the resistance or impedance of the load 10 be exceptionally small, e.g., due to a short between nodes 68 and 70, the current sensed by the current sensor 42 may exceed the maximum allowed current long before the load voltage reaches its nominal value. Defining the maximum allowed current according to the load voltage thus provides a way of estimating the load impedance/resistance during a switch transition well before the load 10 is "fully switched on".

Of course, the maximum-allowed-current unit 34 may be operable to determine the maximum-allowed-current not only during a switch transition, but continuously. The maximum-allowed-current unit 34 may thus determine the maximum-allowed-current in real-time during switch transitions as well as in between, that is, while the switch is in a stationary state.

In the example shown, the voltage level at the high side of the load 10 may be picked off at node 68 and fed to the maximum allowed current unit 34. Similarly, the voltage level on the low side of the load 10 may be picked off at node 70 and fed to the maximum allowed current unit 34. In the example, the load voltage is the difference between these two voltage levels.

The maximum-allowed-current unit 34 may be operable to determine the maximum allowed current such that the maximum allowed current is an increasing function of the load voltage. Additionally or alternatively, the maximum-allowed-current unit 34 may be operable to determine the maximum allowed current such that the maximum allowed current is positive when the load voltage is zero. Additionally or alternatively, the maximum-allowed-current unit 34 may be operable to determine the maximum allowed current such that the maximum allowed current is a bounded function of the load voltage. Mathematically, a function is called bounded if the set of its values is bounded. These and other aspects are further described below, in particular in reference to FIGS. 11, 12, and 13.

Figure 10:
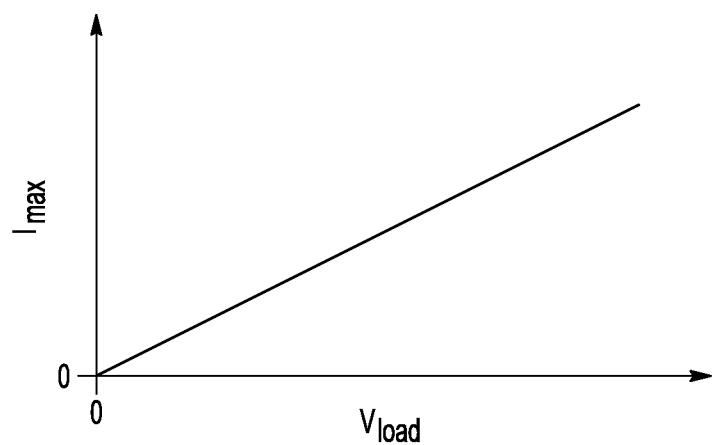
FIG. 10 shows a schematic plot of a maximum allowed current versus the voltage across the load (load voltage), according to an example of an embodiment.

FIG. 10 illustrates one example among a variety of possible ways of defining the maximum allowed current I_max in regard to the load voltage V_load. In the example, I_max may be proportional to V_load. Such definition may amount to setting a lower bound for the resistance or impedance of the load 10. A minimum allowed resistance or impedance of the load 10 may thus be defined.

Figure 11:
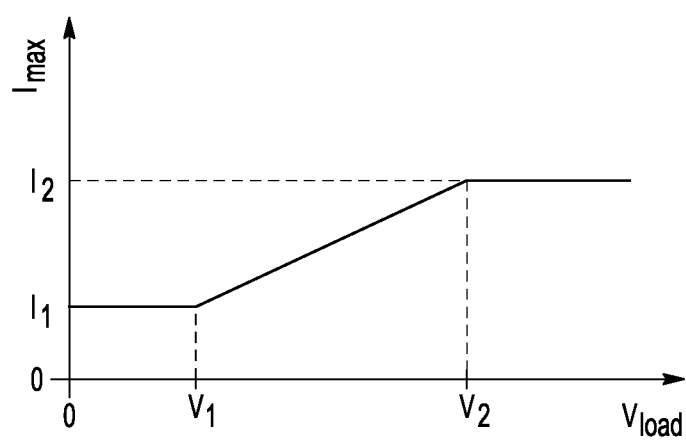
FIG. 11 shows a schematic plot of a maximum allowed current versus the load voltage, according to an example of an embodiment.

FIG. 11 illustrates another example. In this example, I_max may be constant and positive (with value I1) for load voltage levels less than a first voltage level V1. For load voltage levels between V1 and a second voltage level V2, the maximum allowed current may increase to a second current level I2. I_max may, for example, increase linearly. For load voltage levels higher than V2, I_max may assume the constant current level I2.

Such a definition may provide at least two advantages. Firstly, the maximum allowed current having a positive zero offset I1 may render the overcurrent protection mechanism insensitive against current fluctuations at very low load voltage levels which may be difficult to control. Secondly, the maximum allowed current being bounded (e.g. having a constant current level I2 for high levels of the load voltage, e.g. for V_load greater than V2) may ensure that the overcurrent protection mechanism may also provide overvoltage protection. In fact, an unusually high load voltage may be expected to result in an unusually high current through the switch 20 and the load 10. Defining I_max to be bounded may thus ensure that the current may not exceed I_max at high load voltage levels, even when the resistance/impedance of the load 10 is within an allowed range.

Figure 12:
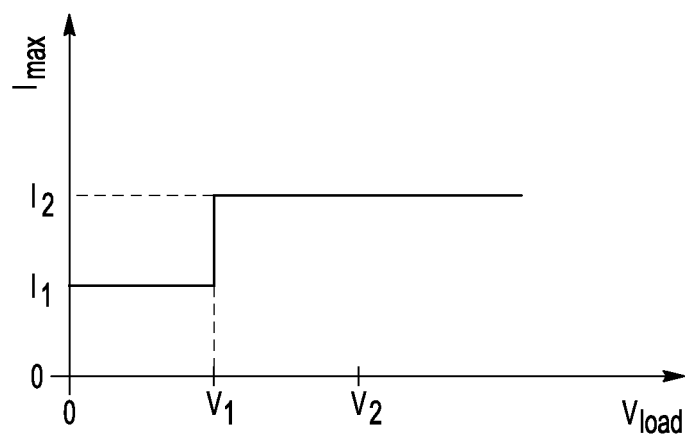
FIG. 12 shows a schematic plot of a maximum allowed current versus the load voltage, according to an example of an embodiment.

FIG. 12 provides a further example of how the maximum current I_max may be defined as a function of the load voltage V_load. In the present example, the maximum allowed current I_max may be a step function of the load voltage V. For example, I_max may assume a constant value I1 when the load voltage is below a first voltage level V1 and assume a higher second value I2 when the load voltage is above V1. For example, V1 may be 0.5 times the supply voltage V_supp. The present example may unite the two advantages mentioned above with respect to FIG. 11 and, in addition, be particularly convenient to implement.

Figure 13:
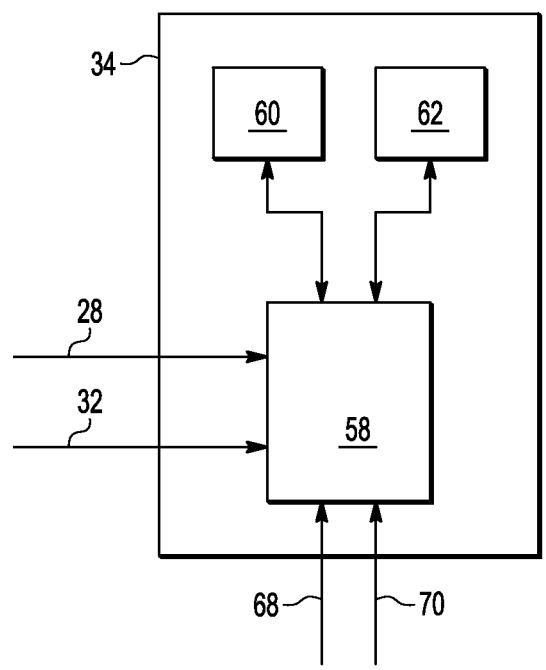
FIG. 13 schematically shows a further example of an embodiment of a maximum allowed current unit.

FIG. 13 illustrates an example embodiment of the maximum-allowed-current unit 34 of the overcurrent protection device 64 in a schematic and simplified manner. The maximum-allowed-current unit 34 may comprise a memory 62 containing data for determining the maximum allowed current as a function of at least a voltage variable. The maximum-allowed-current unit 34 may, for example, be provided by a microcontroller or by dedicated circuitry. The maximum-allowed-current unit 34 may comprise a processor 58, a timer 60, and/or a memory 62. The memory 62 may, for example, contain data for enabling the processor 58 to determine the maximum allowed current as a function of time and load voltage. In one embodiment, the data may comprise a maximum allowed current profile and instructions for enabling the processor 58 to scale the maximum allowed current profile as a function of a load voltage value. For example, the data may include time scaling factors and/or amplitude scaling factors. In the same or in another embodiment, the data may comprise a look-up table for defining at least two different maximum allowed current profiles. The processor 58 may, e.g., be arranged to select one of these profiles as a function of a load voltage. The maximum-allowed-current unit 34 may further comprise the features described above in reference to FIG. 6.

The maximum-allowed-current unit 34 may be operable to determine the maximum allowed current as a product of a first function and a second function, the first function being a function of a time and/or a temperature, and the second function being a function of the load voltage. The first function may, for example, provide a nominal maximum allowed current. The nominal maximum allowed current may, for instance, be determined in dependence on time, but independently from the load voltage. For example, the first function may be a function of an accumulated time during which the power switch (20) was in the conductive state. The first function may notably be designed to allow an inrush current to flow through the power switch 20 during a first period, the inrush current being higher than a maximum allowed current during a subsequent second period. These and other aspects are further described below, in particular in reference to FIGS. 14 and 15.

Figure 14:
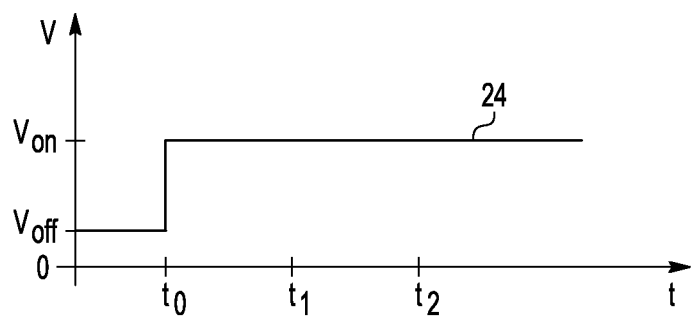
FIG. 14 shows schematic plots of a switch control signal, a load voltage, a resulting current, and a maximum allowed current as functions of time, according to an example of an embodiment.
Figure 14:
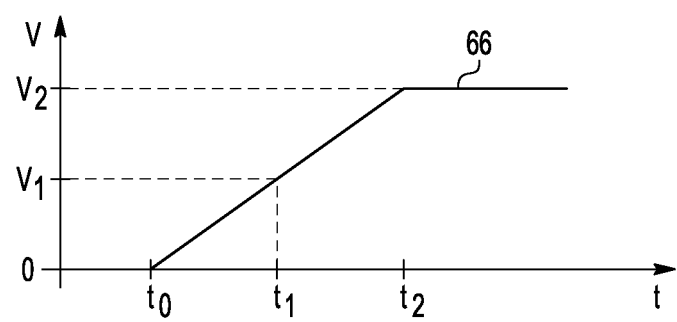
Figure 14:
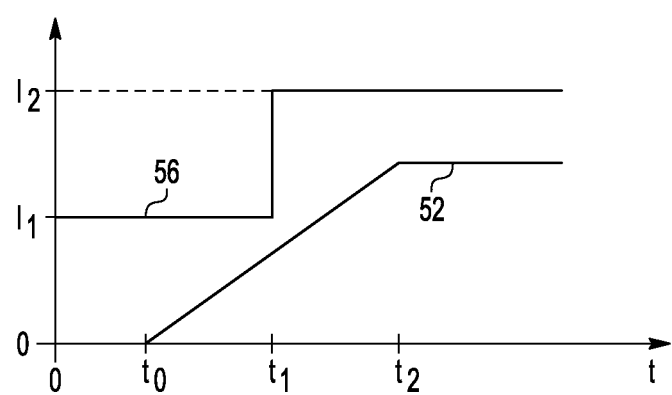

FIG. 14 schematically illustrates, by way of example, a possible variation in time t of the switch control signal 24, the load voltage 66, the maximum allowed current 56, and the current 52 through switch 20. In this example, the switch control signal 24 may be provided by a voltage (switch control voltage) generated by the switch controller 22. The figure focuses on a time interval in which the power switch 20 passes from its nonconductive state into its conductive state. As shown, the switch control voltage 24 passes from a first voltage level V_off (OFF level) to a second voltage level V_on (ON level) at a time t0. The power switch 20, in response to the switch control voltage 24 changing from V_off to V_on, may pass from its nonconductive state into its conductive state in a smooth or stepwise manner. Its conductivity may thus increase from a low conductivity associated with the nonconductive state to a high conductivity associated with the conductive state in a smooth or stepwise manner. The conductivity may thus increase from its low value to its high value via one or more intermediate conductivity values. The transition from the nonconductive state to the conductive state (switch on transition) may, for example, start at a time t0 and end at a later time t2. The transition time, which in this example is the length of the time interval [t0, t2], may be considerably shorter than a duty cycle of the PWM control signal 28. The switch-on transition may, for example, last about 100 microseconds, that is 0.1 milliseconds, compared to, e.g., a duty cycle of more than 1 millisecond. Of course, the switch 20 is not necessarily controlled via a PWM signal; it may instead, for example, be controlled manually.

The load voltage 66, that is the instantaneous voltage across the load 10, may increase smoothly or in a stepwise manner from its value at t0 (e.g., zero or ground) to a second voltage level V2 (e.g., a nominal voltage level for operating the load) as the switch 20 passes into its conductive state. A delay between the rise of the load voltage 66 and the state transition of the switch 20 may be negligible. In other words, the load voltage 66 may be synchronous to the conductivity of the switch 20. More generally, however, the load voltage 66 and/or the current through the load 10 may be delayed relative to variations of the conductivity of the switch 20. This may be due to, for instance, a non-negligible capacitance or inductance of the load 10 and/or the switch 20, or due to some additional module (not shown) which might be coupled in series with the load 10 and/or the switch 20.

The current 52 through the switch 20 may be approximately equal to the current through the load 10 at any given instant. A difference between these two currents might be due, for instance, to some optional circuitry (not shown in the figures) coupled in parallel to only the switch 20 or to only the load 10. For the purpose of understanding the present invention, however, the expressions "current through the switch" and "current through the load" may be interchangeable. In the present example, the current 52 through the switch 20/the load 10 may increase from a first value, e.g., zero, at time t0 to a value I2, e.g., a stationary or only slowly varying nominal current, at time t2 in response to the rise of the voltage 66 across the load. The current 52 may, for instance, be proportional to the load voltage 66. Times t0, t1, and t2, may, for example, be t0=0.015 milliseconds (ms), t1=0.035 ms, and t2=0.055 ms, respectively.

In the example, the maximum allowed current 56 may be determined according to the load voltage 66. The maximum allowed current 56 may, for example, be defined as illustrated above in reference to FIG. 12. The maximum allowed current 56 may accordingly increase as the load voltage 66 increases. For instance, an analog or digital signal indicative of a nominal maximum allowed current 56, defined, e.g., as described above in reference to FIG. 3 or as a time-independent maximum allowed current, may be modulated according to the load voltage 66, to generate a signal indicative of the maximum allowed current 56. For example, the maximum-allowed-current unit 34 may multiply or scale a maximum allowed current value at each instance t with a factor that is a function of the load voltage 66. The factor may, for example, be a function of the load voltage 66 as described in reference to FIGS. 10 to 12. In the present example, the maximum allowed current 56 may be determined by multiplying a nominal maximum allowed current value, which may be stationary over the time range of interest, with a voltage dependent factor that is proportional to the function I_max illustrated above in FIG. 12. The nominal maximum allowed current may accordingly be scaled with a factor of, e.g., 0.5 when the load voltage 66 is below a first level V1 and with a factor of, e.g., 1 when the load voltage 66 is above level V1. In the example, the load voltage 66 may assume voltage level V1 at time t1. V1 may, for example, be 0.5*V2, where V2 is the stationary voltage across the load 10 when the switch 20 has assumed its conductive state. In the example, the current 52 is less than the maximum allowed current 56 for all times t shown in the plot, and power switch 20 may accordingly be controlled to remain in the conductive state.

In other words, the maximum allowed current I_max(t) may be expressed as e.g. the product $f1(t)*f2(V\_load(t))$ where the first function f1 indicates the nominal maximum allowed current, as described e.g. in reference to FIGS. 1 to 8, and the second function f2(V_load(t)) modulates the nominal maximum allowed current in accordance with the load voltage. Thus, the maximum allowed current I_max(t) when considered over a longer period, i.e. longer than shown in FIG. 14, may resemble e.g. graph 56 in FIG. 3, modulated, however, according to f2(V_load(t)). The load voltage V_load(t), in turn, may to a first approximation be proportional to the PWM control signal 28 (if such signal is used) and notably exhibit the same frequency (e.g. of the order of 1 kHz). Thus, the nominal maximum allowed current may be modulated with a frequency of the PWM control signal 28.

Figure 15:
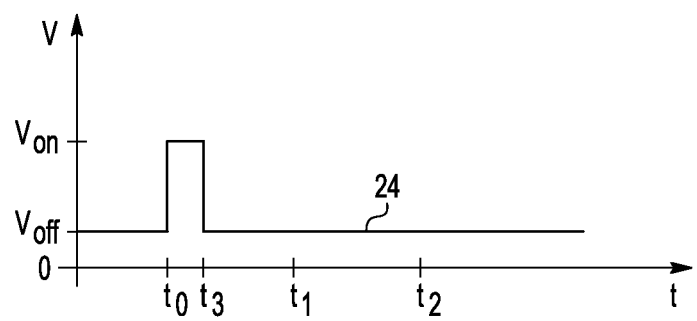
FIG. 15 shows schematic plots of a switch control signal, a load voltage, a resulting current, and a maximum allowed current as functions of time, according to an example in which an overcurrent is detected.
Figure 15:
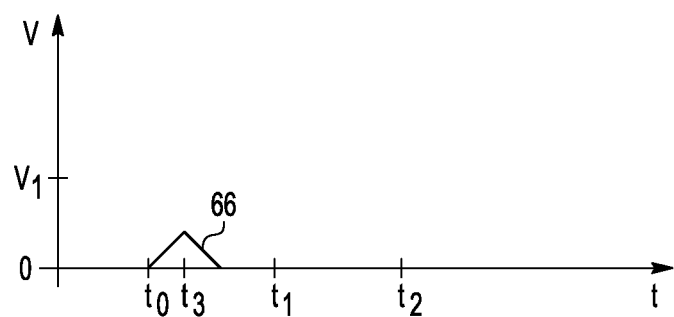
Figure 15:
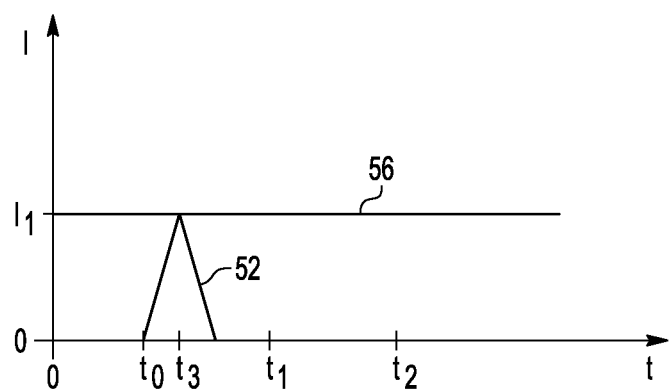

Turning to FIG. 15, the quantities described above in reference to FIG. 14, namely the switch control voltage 24, the load voltage 66, the current 52 through the switch, and the maximum allowed current 56, are now illustrated, by way of example, for a scenario in which the resistance or impedance of the load 10 is below a minimum allowed resistance/impedance or in which there is a short across the load 10. Thus, FIG. 15 relates to a scenario in which the overcurrent protection mechanism is expected to set the switch 20 into the nonconductive state, so as to interrupt the conductor 16.

In this example, switch control voltage 24 may rise from V_off to V_on at time t0, for example, in response to a rising edge of PWM control signal 28 or in response to some other input signal. Switch 20, in response to switch control voltage 24, may pass into the conductive state in a smooth or stepwise rather than instant manner. The load voltage 66 may thus rise smoothly or in steps. The current 52 may rise in response to the increase of the load voltage 66. In the present scenario, the rate of change of current 52 with respect to voltage 66 is higher compared to the scenario of FIG. 14. This may be due to, for example, the load having a resistance which is too low or to a short. In the example, current 52 reaches the maximum allowed current 56 at a time t3. Time t3 may be greater than t0 but less than t1. The switch control voltage 24, in response to current 52 exceeding the maximum allowed current 56, may decrease from its level V_on to its level V_off. This may, in turn, trigger the power switch 20 to return to the nonconductive state. In the example, the switch 20 may assume the nonconductive state at a time between t3 and t1. The voltage 66 across the load 10 may thus fall to its initial level (ground or zero in this example) at a time between t3 and t1. The current 52 may decrease accordingly. In the example, current 52 may reach its initial value of zero in a time between t3 and t1.

It is noted that in the present example, the switch 20 is triggered to return to the nonconductive state at a time at which the load voltage 66 is below voltage level V1 mentioned above in reference to FIG. 14. The load voltage 66 may therefore not reach V1. The maximum allowed current 56 may, therefore, assume the value I1 at all times t represented in the plot.

At times t after time t3, switch control voltage 24 may again rise from the OFF level V_off to the ON level V_on, e.g., after a predefined delay (not shown in the figure). Alternatively, the overcurrent protection device 64 may block the switch 20 to ensure that the switch 20 remains in the nonconductive state after it has been detected that the current 52 has reached or exceeded the maximum allowed current 56. For example, the overcurrent protection device 64 may set an error flag in response to the current 52 reaching the maximum allowed current 56.

Figure 16:
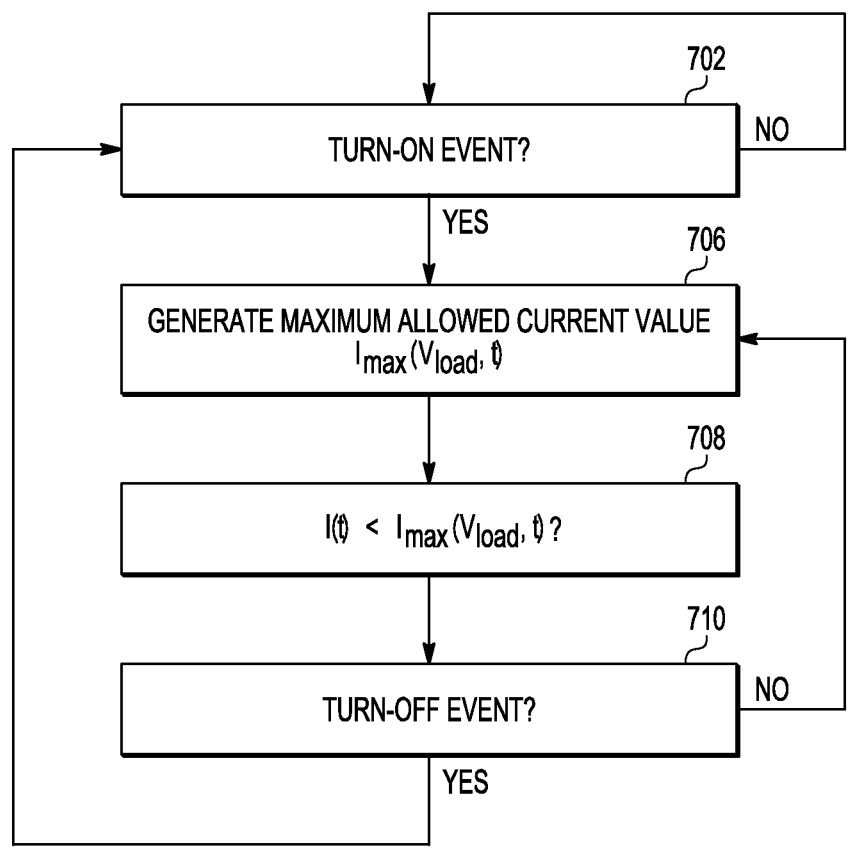
FIG. 16 shows a schematic flowchart of an example of a method of operating a power switch.

Turning now to FIG. 16, an example of a method of operating a power switch is illustrated. The power switch may, for example, be the power switch 20 integrated in overcurrent protection device 64 described above in reference to FIG. 9. Thus, the power switch 20 may have a conductive state and a nonconductive state. The method may comprise, e.g., connecting a load 10 in series with the power switch 20; applying a supply voltage across the load 10 and the switch 20, for powering the load 10, to generate a load voltage, said load voltage being a voltage across the load 10; determining in real-time a maximum allowed current at least partially on an instantaneous level of the load voltage; and setting the power switch 20 into the nonconductive state in response to an indication that a current through the power switch 20 is exceeding the maximum allowed current. Said determining may notably comprise determining said maximum allowed current in real-time during a transition of the power switch 20 from the nonconductive state to the conductive state.

In block 702, it may be determined whether a turn-on event has occurred. A turn-on event may be any event that may indicate that a load coupled in series with the switch is intended to be energized. A turn-on event may, for example, be a user action aimed at powering the load, or a duty cycle of a PWM control signal, e.g., PWM control signal 28, being increased above a specified threshold. A reference time t, e.g., an accumulated time during which the switch has been in the conductive state, may be set to zero. The reference time may serve as a reference for determining the maximum allowed current. If a turn-on event is detected, the flow may proceed; otherwise, the flow may return, e.g. to block 702.

In subsequent block 706, a maximum allowed current may be determined according to the instantaneous voltage across the load. The instantaneous voltage across the load (load voltage) may, for example, be the load voltage 66 described above in reference to FIGS. 14 and 15. The maximum allowed current may, for example, be a time dependent nominal maximal allowed current that is multiplied in real-time by an increasing function of the load voltage. The nominal maximal allowed current and/or said function of the load voltage may for instance be predefined, e.g. by hardware or by data residing in a memory.

In subsequent block 708, it may be checked whether the instantaneous current through the switch is below the thus determined instantaneous maximum allowed current. If it is determined that the current through the switch exceeds the maximum allowed current, the switch may be triggered to assume its nonconductive state.

In subsequent block 710, it may be checked whether a turn-off event has occurred. A turn-off event may be any event which may indicate that the load is intended to be powered off. If a turn-off event is detected, the flow may return, e.g. to block 702; otherwise, the flow may return e.g. to block 706.

Figure 17:
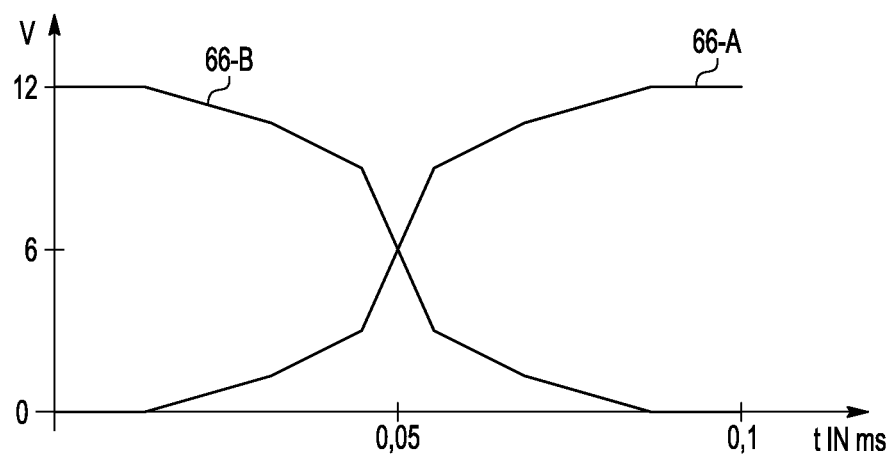
FIG. 17 shows a schematic plot of an example of a rising edge and a falling edge of the load voltage.

Referring now to FIG. 17, an example of a rising edge 66-A and a falling edge 66-B of the voltage 66 across the load 10 shown in FIG. 9 is illustrated. In the example, the load voltage 66 may gradually rise from its minimum value to its maximum value in response to the switch 20 passing from its nonconductive state to its conductive state. Similarly, the load voltage 66 may gradually fall from its maximum value to its minimum value in response to the switch 20 passing from its conductive state to its nonconductive state. The minimum voltage value and the maximum voltage value may, for example, be 0 volts and 12 volts, respectively. The maximum voltage value may, for instance, be a supply voltage. Notably, the rise time, i.e. the duration of the rising edge, and the fall time, i.e. the duration of the falling edge may be equal. For example, both the rising edge 66 and the falling edge 66 prime may each have a length of approximately 100 microseconds. The rise time may be sufficiently long to allow a maximum allowed current to be determined in real-time as a function of the load voltage, so as to enable detection of an overcurrent situation before the load voltage has reached its maximum.

Comparing overcurrent protection device 18 and overcurrent protection device 64, it may be noticed that the two device may differ at least in the way in which the respective maximum-allowed-current unit 34 may determine a maximum allowed current. Overcurrent protection device 18 may determine the maximum-allowed current at least according to a supply voltage. Overcurrent protection device 64 may determine the maximum-allowed-current at least according to a load voltage. The supply voltage may be unaffected by state transitions of the switch 20. The load voltage, in contrast, may be affected by state transitions of the switch 20.

Every physical quantity, such as a temperature, voltage, or current, may be represented by a value or by a set of values. A voltage is a potential difference between two particular points at a given moment. A current is an amount of charge flowing through a particular cross section at a given moment.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, power switch 20 and switch controller 22 may be provided by an integrated circuit; and/or turn-on detector 30, maximum-allowed-current unit 34, and comparator 38 may be provided by an integrated circuit. PWM unit 26 may be integrated in the overcurrent protection device 18, or form a separate module. The entire overcurrent protection device 18 may be provided by an integrated circuit or a system on chip (SoC).

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, power switch 20 and switch controller 22 may be provided by an integrated circuit; and/or turn-on detector 30, maximum-allowed-current unit 34, and comparator 38 may be provided by an integrated circuit. PWM unit 26 may be integrated in the overcurrent protection device 18, or form a separate module. The entire overcurrent protection device 18 may be provided by an integrated circuit or a system on chip (SoC). Alternatively, the examples may be implemented as any number of separate integrated circuits or separate devices interconnected with each other in a suitable manner. For example, each of components 20, 22, 26, 30, 34, 38, 42 may be provided by a separate device.

Also for example, the examples, or portions thereof, may be implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the description and in the claims, the symbol "=" means "equal to". The symbol "<" means "less than". The symbol ">" means "greater than". The symbol "=<" means "less than or equal to". The symbol ">=" means "greater than or equal to". The interval [A, B] is the set of real numbers X such that $A=<X=<B$. The interval [A, B] is the set of real numbers X such that $A<X=<B$. The interval [A, B] is the set of real numbers X such that $A=\leq X \leq B$. The interval (A, B) is the set of real numbers X such that $A \leq X \leq B$.

In the figures, any arrow in a device plot may represent a transfer in the direction indicated by the arrow, unless stated otherwise. Depending on the context, the transfer may, for example, be an electric charge transfer, an information or data transfer, a signal transfer, or any other kind of transfer. Any arrow may, in addition, represent a connection for allowing the transfer represented by the arrow. Thus, any arrow may represent both the transfer and the connection. Depending on the kind of transfer, a connection may be provided by e.g. a data bus, a pair comprising a transmitter and a receiver, an electric conductor, or any other suitable connection. A connection is not necessarily provided by a distinct component. The direction of an arrow does not indicate a unidirectional connection, unless stated otherwise. In other words, any connection represented by a unidirectional arrow may be a unidirectional connection or a bidirectional connection, unless stated otherwise.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An overcurrent protection device, comprising:
   a maximum-allowed-current unit configured to determine a maximum allowed current in real-time, wherein said maximum allowed current is determined based on a selected one of a plurality of maximum allowed current profiles stored in a memory, and wherein the selected maximum allowed current profile is based on an instantaneous level of a supply voltage, and said supply voltage is a voltage across the overcurrent protection device and a load to be powered; and
   a power switch connectable with a switch input to a voltage supply and with a switch output to said load, and configured to provide power to said load, wherein said power switch has a conductive state and a nonconductive state, and the power switch is arranged to assume the nonconductive state in response to an indication that a current through the power switch is exceeding the maximum allowed current; and
   a turn-on detector to communicate with the power switch, the turn-on detector to detect a turn-on event for the power switch in response to a first edge of a pulse width modulation control signal, to trigger a first edge of a turn-on detection signal in response to the first edge of the pulse width modulation control signal, and to trigger a second edge in the turn-on detection signal in response to a second edge of the pulse width modulation control signal with a particular amount of delay from the first edge of the pulse width modulation control signal being detected.

2. The overcurrent protection device as set forth in claim 1, wherein the power switch is arranged to pass from the nonconductive state into the conductive state via at least one intermediate state.

3. The overcurrent protection device as set forth in claim 1, wherein the maximum-allowed-current unit is operable to determine the maximum allowed current in real-time during a transition of the power switch from the nonconductive state to the conductive state.

4. The overcurrent protection device as set forth in claim 1, wherein the maximum-allowed-current unit is operable to further determine the maximum allowed current as a product of a first function and a second function, the first function being a function of one or more of a time and a temperature, and the second function being a function of a load voltage.

5. The overcurrent protection device as set forth in claim 4, wherein said first function allows an inrush current to flow through the power switch during a first period, and the inrush current is higher than a maximum allowed current during a subsequent second period.

6. The overcurrent protection device as set forth in claim 4, wherein said first function is a function of an accumulated time during which the power switch is in the conductive state.

7. The overcurrent protection device as set forth in claim 1, wherein the maximum-allowed-current unit comprises a memory containing data for determining the selected maximum allowed current profile as a function of at least a voltage variable.

8. The overcurrent protection device as set forth in claim 1, wherein the maximum-allowed-current unit is operable to determine the maximum allowed current as an increasing function of the supply voltage.

9. The overcurrent protection device as set forth in claim 1, wherein the maximum-allowed-current unit is operable to determine the maximum allowed current such that the maximum allowed current is positive when the supply voltage is zero.

10. The overcurrent protection device as set forth in claim 1, wherein the maximum-allowed-current unit is operable to further determine the maximum allowed current as a bounded function of a load voltage.

11. The overcurrent protection device as set forth in claim 1, comprising a switch controller for setting the power switch alternatively into the conductive state and into the nonconductive state in response a pulse width modulated control signal.

12. The overcurrent protection device as set forth in claim 1 wherein
the turn-on event comprises the pulse width modulated control signal indicating, during an interval having a length of at least a minimum off-time, that the power switch is to assume the nonconductive state, followed by the pulse width modulated control signal indicating that the power switch is to assume the conductive state.

13. The overcurrent protection device as set forth in claim 1, wherein the load is a lamp.

14. A method of operating a power switch, wherein the power switch has a conductive state and a nonconductive state and the method comprises:
connecting a load in series with the power switch;
applying a supply voltage across the load and the switch, for powering the load, to generate a load voltage, said load voltage being a voltage across the load;
determining in real-time a maximum allowed current at least partially on an instantaneous level of the supply voltage based on a selected one of a plurality of maximum allowed current profiles stored in a memory, and wherein the selected maximum allowed current profile is based on the supply voltage;
setting the power switch into the nonconductive state in response to an indication that a current through the power switch is exceeding the maximum allowed current;
detecting a turn event for the power switch in response to a first edge of a pulse width modulation control signal;
triggering a first edge of a turn-on detection signal in response to the first edge of the pulse width modulation control signal; and
triggering a second edge in the turn-on detection signal in response to a second edge of the pulse width modulation control signal with a particular amount of delay from a first edge of the width modulation control signal detected.

15. The method as set forth in claim 14, wherein said determining comprises:
determining said maximum allowed current in real-time during a transition of the power switch from the nonconductive state to the conductive state.

16. The method as set forth in claim 14, wherein said determining comprises:
determining said maximum allowed current further as a product of a first function and a second function, wherein the first function is a function of one or more of a time and temperature, and the second function is a function of the load voltage.

17. The method of as set forth in claim 16 wherein said first function is a function of an accumulated time during which the power switch is in the conductive state.

18. The method as set forth in claim 14, wherein said determining comprises:
determining said maximum allowed current further as an increasing function of the load voltage.

19. The method as set forth in claim 14, wherein said determining comprises:
determining said maximum allowed current as a bounded function of the load voltage.

* * * * *